United States Patent
Soukhojak et al.

(10) Patent No.: US 12,392,051 B2
(45) Date of Patent: Aug. 19, 2025

(54) SiC CRYSTAL GROWTH APPARATUS AND METHOD

(71) Applicant: SK Siltron CSS, LLC, Wilmington, DE (US)

(72) Inventors: Andrey Soukhojak, Bay City, MI (US); Ian Manning, Bay City, MI (US)

(73) Assignee: SK Siltron CSS, LLC, Wilmington, DE (US)

( * ) Notice: Subject to any disclaimer, the term of this patent is extended or adjusted under 35 U.S.C. 154(b) by 293 days.

(21) Appl. No.: 18/127,757

(22) Filed: Mar. 29, 2023

(65) Prior Publication Data

US 2024/0328031 A1   Oct. 3, 2024

(51) Int. Cl.
| | |
|---|---|
| C30B 23/02 | (2006.01) |
| C30B 23/00 | (2006.01) |
| C30B 29/36 | (2006.01) |

(52) U.S. Cl.
CPC ............ C30B 23/005 (2013.01); C30B 23/02 (2013.01); C30B 29/36 (2013.01)

(58) Field of Classification Search
CPC ........ C30B 23/005; C30B 23/02; C30B 29/36
See application file for complete search history.

(56) References Cited

U.S. PATENT DOCUMENTS

| | | | | |
|---|---|---|---|---|
| 9,738,991 B2 * | 8/2017 | Loboda | ................ | C30B 23/025 |
| 2006/0254505 A1 * | 11/2006 | Tsvetkov | ................ | C30B 29/36 |
| | | | | 117/104 |
| 2008/0083366 A1 * | 4/2008 | Basceri | ................ | H10D 62/8325 |
| | | | | 257/E21.097 |
| 2014/0216330 A1 | 8/2014 | Shin et al. | | |
| 2015/0058445 A1 * | 2/2015 | Choi | ................ | H04L 67/025 |
| | | | | 709/217 |

FOREIGN PATENT DOCUMENTS

| | | | | |
|---|---|---|---|---|
| CN | 114645319 | * | 6/2022 | |
| CN | 115212656 A | * | 10/2022 | ......... B01D 46/0001 |
| KR | 10-2013-0006841 | | 1/2013 | |
| KR | 10-2015-0116885 | | 10/2015 | |

OTHER PUBLICATIONS

Korean Office Action dated Apr. 25, 2024, issued in application No. 10-2023-0044157.

* cited by examiner

*Primary Examiner* — Robert M Kunemund
(74) *Attorney, Agent, or Firm* — KED & ASSOCIATES, LLP

(57) ABSTRACT

Disclosed is a SiC crystal growth apparatus including a reaction cell provided in a vacuum furnace such that SiC crystals are grown in the reaction cell, the reaction cell is configured such that a source is disposed in a lower region of an area defined by a crucible and a cover and a seed is provided below the cover, and a filter configured to filter out particles from gas supplied from the source is provided between the seed and the source, the filter includes a first layer, a second layer, and a third layer disposed in a direction from the source to the seed and spaced apart from each other, first through holes, second through holes, and third through holes are formed through the first layer, the second layer, and the third layer, respectively, and centers of the first to third holes form a face-centered cubic structure.

20 Claims, 10 Drawing Sheets

[FIG. 1]
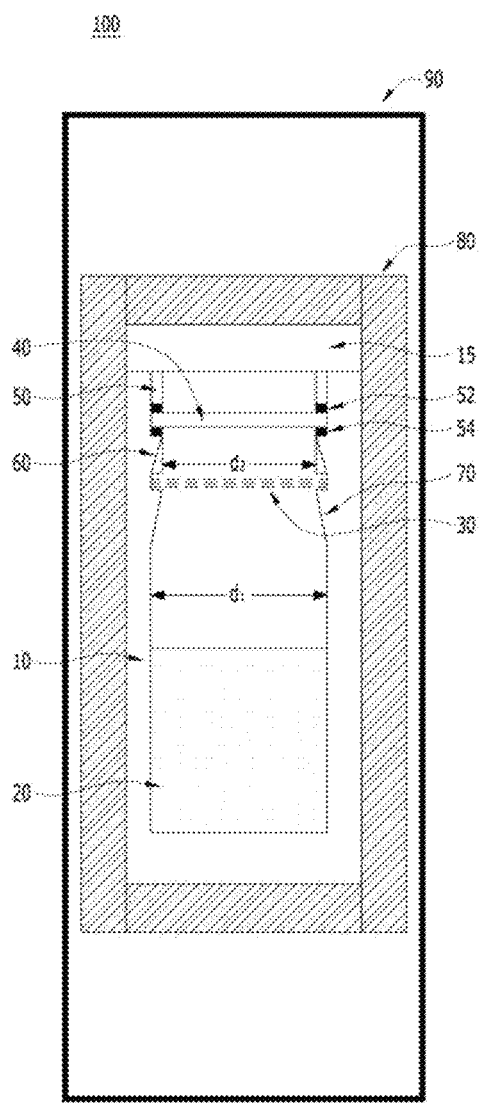

[FIG. 2]
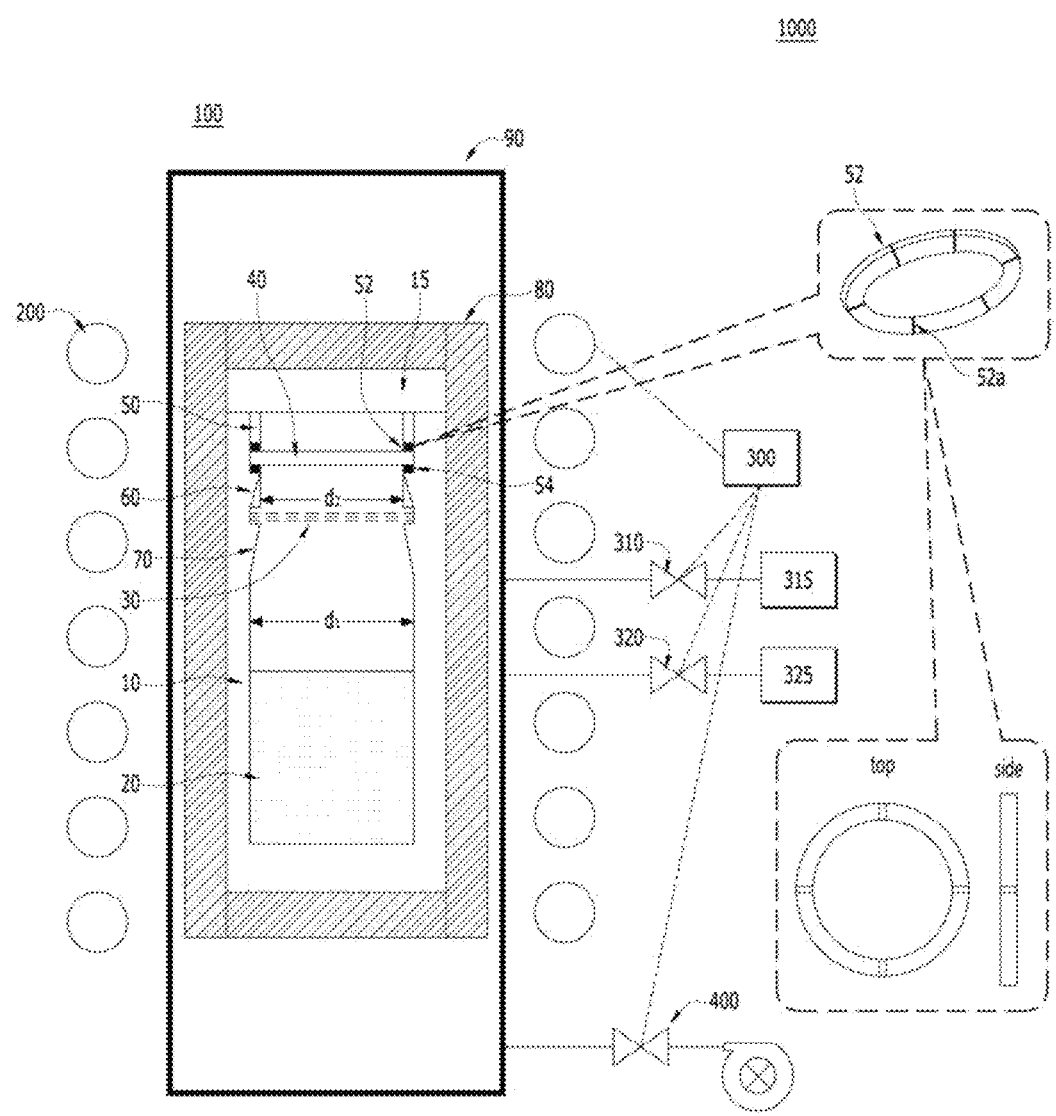

[FIG. 3]
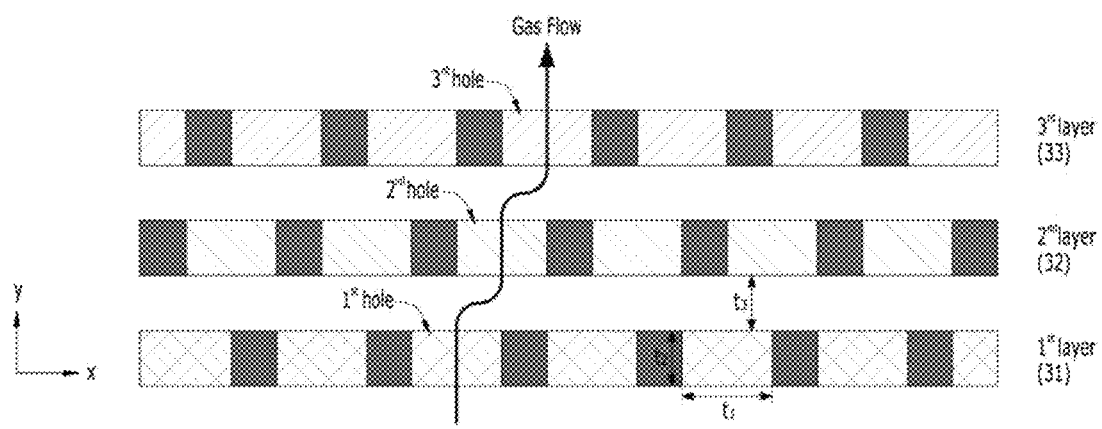
[FIG. 4A]
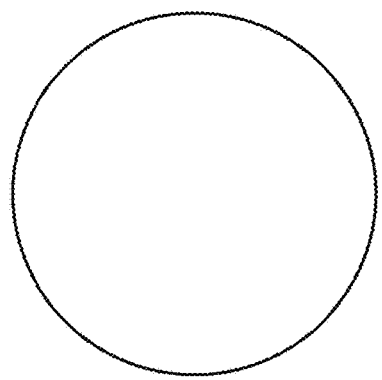

【FIG. 4B】
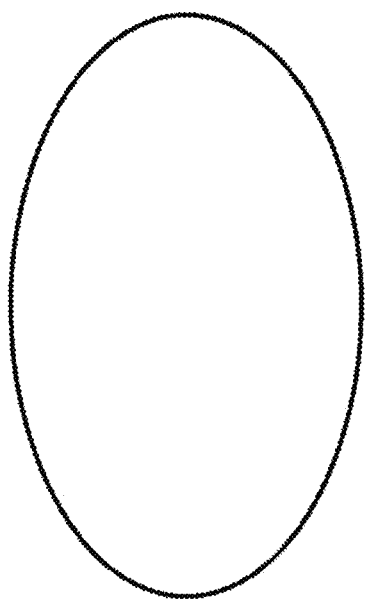
【FIG. 4C】
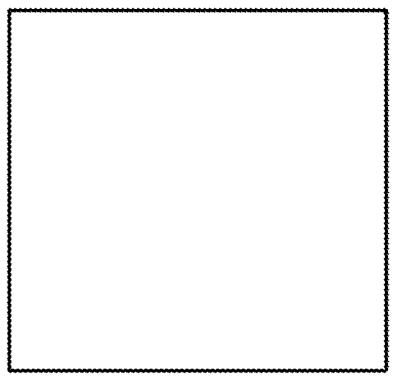

【FIG. 4D】
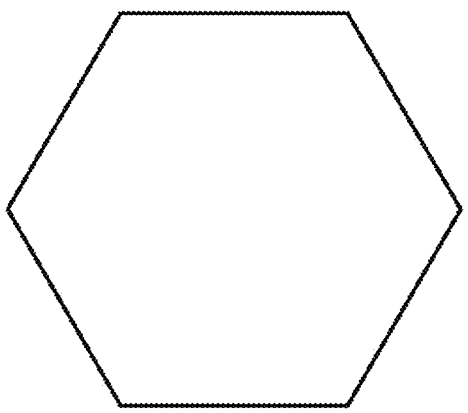
【FIG. 4E】
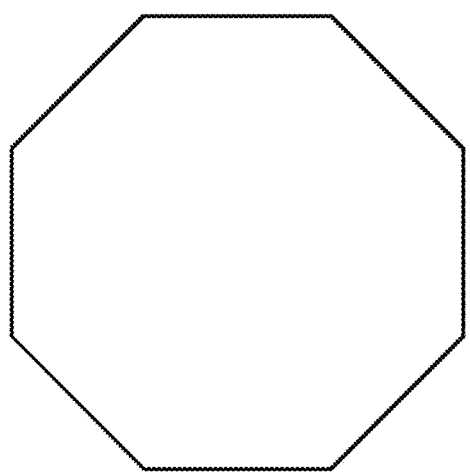

[FIG. 5A]
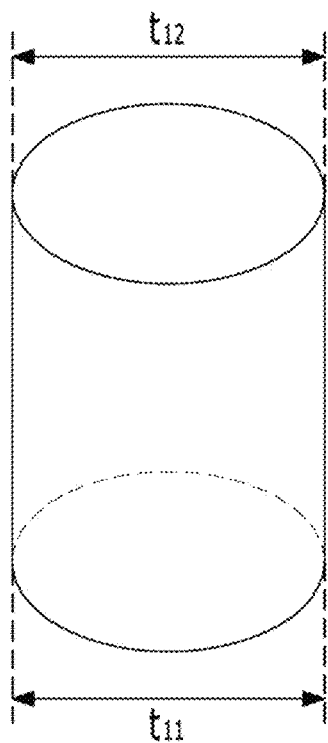
[FIG. 5B]
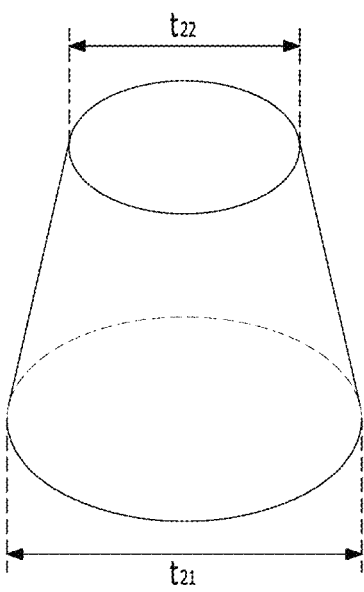

【FIG. 5C】
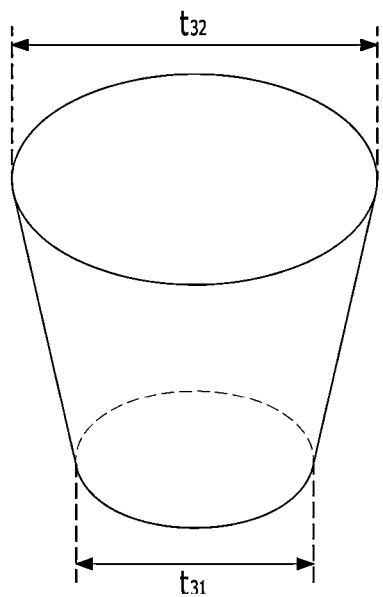
【FIG. 5D】
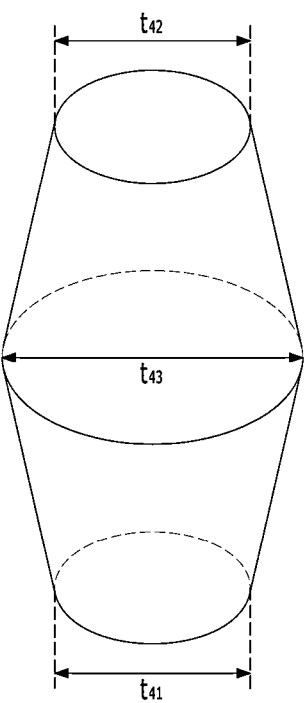

[FIG. 5E]
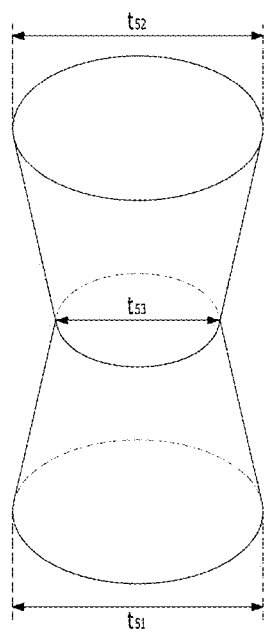
[FIG. 6A]
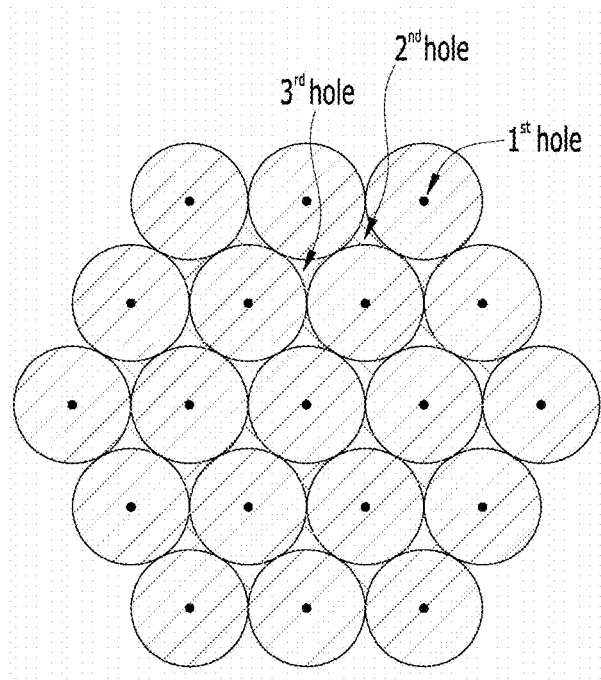

[FIG. 6B]
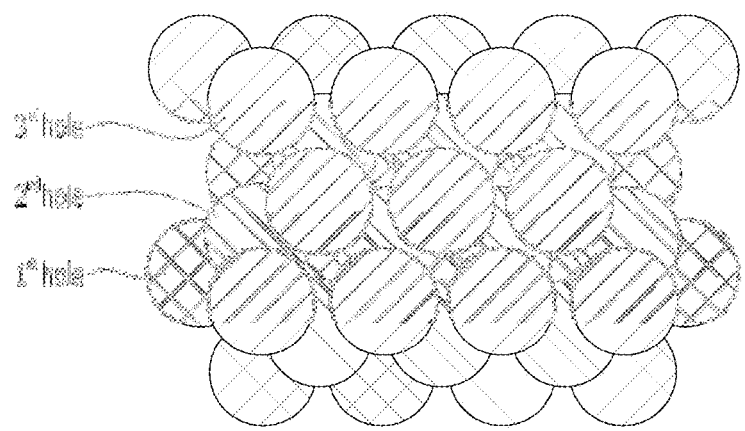

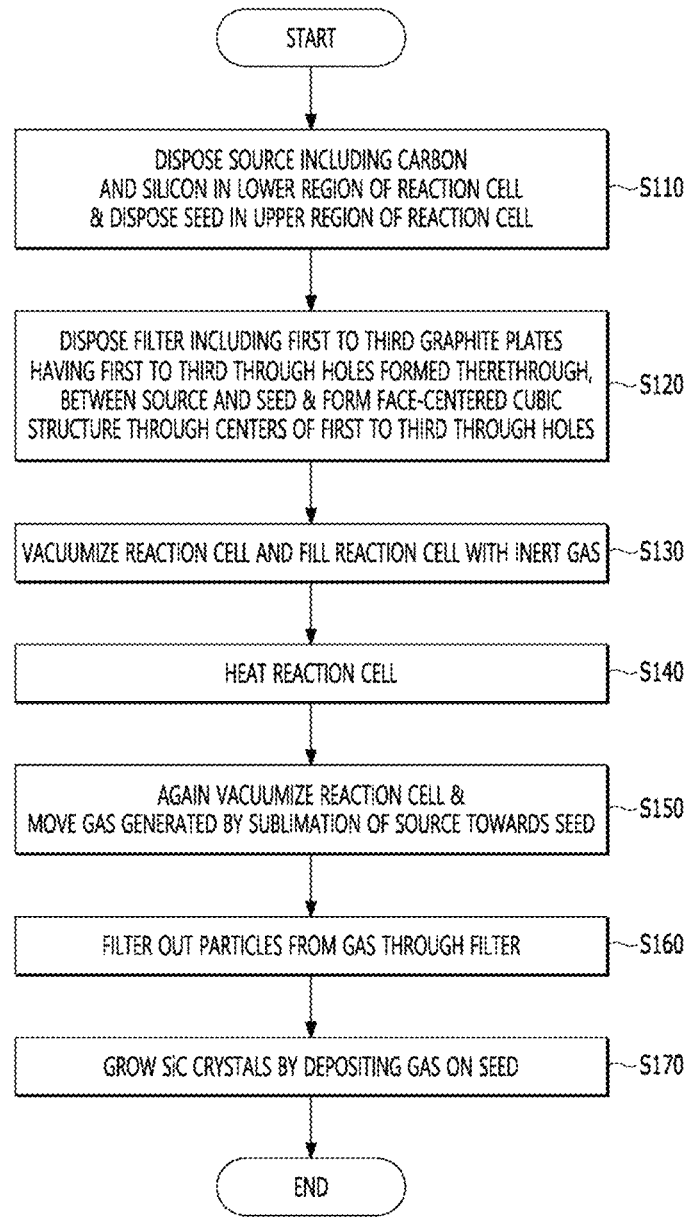

SiC CRYSTAL GROWTH APPARATUS AND METHOD

BACKGROUND OF THE INVENTION

Field of the Invention

The present invention relates to a silicon carbide (SiC) crystal growth apparatus and method, and more particularly, to an apparatus and method for growing SiC single crystals having excellent quality, in which particles are filtered out from gas supplied from a carbon and silicon source.

Discussion of the Related Art

SiC is a crystalline semiconductor material having a wide band gap and excellent hardness, thermal conductivity and chemical inactivity. Due to these characteristics, semiconductor devices manufactured from SiC have superior performance, such as improved power density, to semiconductor devices manufactured from other materials, such as silicon (Si).

SiC may generally have a structure in which silicon (Si) atoms and carbon (C) atoms are stacked in a cubic arrangement or a hexagonal arrangement. The silicon atoms and the carbon atoms may be stacked in multiple forms known as polytypes.

SiC crystals do not occur naturally, and should be synthesized artificially. The SiC crystals may be grown by sublimation or chemical deposition.

Physical Vapor Transport (hereinafter referred to as "PVT") is a SiC growth method using sublimation.

In conventional SiC crystal growth using the PVT, a source including granulated SiC or silicon and carbon is disposed in the lower region of a reaction cell, and a seed is disposed in the upper region of the reaction cell.

Further, the reaction cell is located in a furnace vacuum-pumped by a vacuum pump, and the furnace may be heated by various methods.

Here, silicon and carbon are evaporated from the source and condensed on the seed, and silicon and carbon which are not condensed on the seed are discharged to the outside of the reaction cell, and may thus be diffused to the inside of the furnace in a vacuum state.

However, the conventional SiC crystal growth apparatus and method have the following problem.

Gas evaporated from the heated source and heading towards the seed may include silicon and carbon particles in addition to silicon atoms and carbon atoms. When these particles, particularly, carbon particles, are deposited on the surfaces of growing SiC crystals, a SiC crystal defect may be generated and thereby the quality of the SiC crystals may be deteriorated.

SUMMARY OF THE INVENTION

Accordingly, the present invention is directed to a SiC crystal growth apparatus and method that substantially obviate one or more problems due to limitations and disadvantages of the related art.

An object of the present invention is to provide an apparatus and method for growing SiC single crystals having excellent quality, in which particles in gas evaporated from a source do not deposited on a surface of SiC crystals during growth of the SiC crystals, and thus do not cause any crystal defects.

To achieve these objects and other advantages and in accordance with the purpose of the invention, as embodied and broadly described herein, a SiC crystal growth apparatus includes a reaction cell provided in a vacuum furnace such that SiC crystals are grown in the reaction cell, wherein the reaction cell is configured such that a source including carbon and silicon is disposed in a lower region of an area defined by a crucible and a cover and a seed is provided below the cover, and a filter configured to filter out particles from gas supplied from the source is provided between the seed and the source, wherein the filter includes a first layer, a second layer, and a third layer disposed in a direction from the source to the seed, and spaced apart from each other, first through holes, second through holes, and third through holes are formed through the first layer, the second layer, and the third layer, respectively, and the first through holes, the second through holes, and the third through holes are arranged not to overlap completely with each other when viewed along the direction perpendicular to said layers.

Centers of the first through holes, the second through holes, and the third through holes may form a face-centered cubic (FCC) structure or a derivative of this structure obtained by deforming the cube defining the FCC structure along a chosen direction, e.g. stretching along a cube's body diagonal and thus forming a derivative structure with rhombohedral symmetry. A lower-symmetry deformation of the FCC structure can be used as well.

The first layer, the second layer, and the third layer may have a thickness of 1 nanometer to 10 centimeters.

The first layer and the second layer or the second layer and the third layer may be spaced apart from each other by 1 nanometer to 10 centimeters.

The first through holes, the second through holes, and the third through holes may have the same shape.

The first through holes, the second through holes, and the third through holes may have the same shape, but may have different sizes.

The size of the first through holes in a lateral direction may be the largest, and the size of the third through holes in the lateral direction may be the smallest.

The first through holes, the second through holes, and the third through holes may have a circular, polygonal, or oval cross-section.

The cross-section of each of the first through holes, the second through holes, and the third through holes may be decreased in the direction from the source to the seed.

The SiC crystal growth apparatus may further include an insulator configured to surround the reaction cell.

The SiC crystal growth apparatus may further include a filter support configured to support an edge of the filter on an inner wall of the reaction cell.

The inner wall of the reaction cell may have an inclined part configured to be inclined inwards from an upper region of the source to the filter support.

The SiC crystal growth apparatus may further include a fixing member configured to fix the seed to the cover.

A width of an inner wall of the reaction cell at a height between the source and the filter may be smaller than a width of the inner wall of the reaction cell at a height equal to the source and a width of the inner wall of the reaction cell at a height equal to the filter.

In another aspect of the present invention, there is provided a SiC crystal growth method including disposing a source including carbon and silicon in a lower region of a reaction cell and disposing a seed in an upper region of the reaction cell, evacuating the reaction cell and filling the reaction cell with inert gas, heating the reaction cell, again evacuating the reaction cell and moving gas including carbon and silicon atoms from the source towards the seed, and filtering out carbon or silicon particles from in the gas through a filter, wherein, in filtering out the carbon or silicon particles, the filter including first, second, and third graphite plates disposed in a direction from the source to the seed, provided with first, second, and third through holes respectively formed therethrough, and having a thickness of 1 nanometer to 10 centimeters is used, and centers of the first through holes, the second through holes, and the third through holes may form a face-centered cubic structure.

In filling the reaction cell, the reaction cell may be filled with the inert gas at a pressure exceeding 600 Torr.

In heating the reaction cell, the reaction cell may be heated to a temperature of 2,000 to 2,500° C.

In again evacuating the reaction cell, the reaction cell may be evacuating at a pressure of 0.1 to 100 Torr.

In yet another aspect of the present invention, there is provided a SiC crystal growth apparatus including a reaction cell provided in a vacuum furnace such that SiC crystals are grown in the reaction cell, wherein the reaction cell is configured such that a source including carbon and silicon is disposed in a lower region of an area defined by a crucible and a cover and a seed is provided below the cover, and a filter configured to filter out particles from gas supplied from the source is provided between the seed and the source, wherein the filter has a plurality of passages configured to move the gas in a direction not parallel to a longitudinal direction.

The plurality of passages may include points configured to form a face-centered cubic structure in the filter.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 1 is a longitudinal-sectional view of a reaction cell of a SiC crystal growth apparatus according to one embodiment of the present invention;

FIG. 2 is a longitudinal-sectional view of one example of the SiC crystal growth apparatus including the reaction cell shown in FIG. 1;

FIG. 3 is a longitudinal-sectional view of one example of a filter shown in FIG. 1;

FIGS. 4A to 4E are cross-sectional views of respective examples of through holes provided in the filter shown in FIG. 3;

FIGS. 5A to 5E are perspective views of the respective examples of the through holes provided in the filter shown in FIG. 3;

FIG. 6A and FIG. 6B are a perspective view three-dimensionally illustrating the arrangement of first to third through holes of the filter shown in FIG. 3; and FIG. 7 is a flowchart representing a SiC crystal growth method according to one embodiment of the present invention.

DETAILED DESCRIPTION OF THE INVENTION

Hereinafter, some embodiments of the present invention will be described in detail with reference to the accompanying drawings. In the drawings, the same or similar elements are denoted by the same reference numerals even though they are depicted in different drawings. In the following description of the embodiments of the present invention, a detailed description of known functions and configurations incorporated herein will be omitted when it may make the subject matter of the present invention rather unclear.

In the following description of the embodiments of the present invention, when an element is referred to as being "on" or "under" another element, the two elements may directly contact each other, or one or more intervening elements may be present therebetween. Further, it will be understood that the term "on" or "under" may encompass both orientations of above and below one element.

In a SiC crystal growth apparatus and method according to the present invention, a filter may be disposed above a source, and may filter out particles from gas produced by sublimating the source so as to prevent the particles from being transmitted to a seed and deposited on the surface of the seed. Here, the particles are larger particles than atoms, and mainly, may be carbon particles and silicon particles.

FIG. 1 is a longitudinal-sectional view of a reaction cell of a SiC crystal growth apparatus according to one embodiment of the present invention.

An area formed by a crucible 10 and a cover 15 may form the reaction cell 100 within a furnace 90 in a vacuum state. The crucible 10 and the cover 15 may be formed of an insulating material, and, for example, is formed of graphite.

A source 20 including silicon carbide or carbon and silicon is disposed in the lower region, and a seed 40 is provided below the cover 15, within the area formed by the crucible 10 and the cover 15.

A filter 30 may be provided between the source 20 and the seed 40. The filter 30 will be described below with reference to FIG. 3.

The seed 40 disposed below the cover 15 may be fixed to the cover 15 by fixing members. The fixing members may include a spacer 50 and a ring 52. The spacer 50 spaces the seed 40 apart from the cover 15 by a designated distance, and the first ring 52 at the lower end of the spacer 50 comes into contact with the edge of the upper surface of the seed 40. The edge of the lower surface of the seed 40 may come into contact with a second ring 54 so as to be supported thereby.

A rack 60 may be provided under the seed 40 and the second ring 54. The rack 60 may support the second ring 54. The inner area of the reaction cell 100 at the height of the rack 60 has a second width d2, and the second width d2 may be smaller than a second width d1 of the inner area of the reaction cell 100 at different heights.

The rack 60 may be manufactured as a graphite ring coupled to the inner wall of the crucible 10, or may be manufactured integrally with the crucible 10.

The inner wall of the crucible 10 under the filter 30 may have an inclined part 70 which is inclined inwards. Further, the edge of the filter 30 may be supported by or fixed to the upper surface of the inclined part 70. Such an upper surface of the inclined part 70 may be referred to as a filter support.

That is, the inner wall of the reaction cell 100 may have an inclined portion 70 inclined inward from an upper of the source 20 to the filter support.

Due to this inclined structure, the width of the inner wall of the reaction cell 100 at the inclined part 70, i.e., at the height between the source 20 and the filter 30, may be smaller than the width of the inner wall of the reaction cell 100 at the same height as the source 20 and the width (equal to the width d1) of the inner wall of the reaction cell 100 at the same height as the filter 30.

The crucible 10 and the cover 15 may be surrounded by an insulator 80 within the furnace 90, and the insulator 80 may be formed of, for example, graphite.

FIG. 2 is a longitudinal-sectional view of one example of the SiC crystal growth apparatus including the reaction cell shown in FIG. 1.

The SiC crystal growth apparatus 1000 according to this embodiment may have a heater unit 200 configured to surround the side surface of the reaction cell 100. The heater unit 200 may be, for example, an RF induction coil.

A first supply source 315 and a second supply source 325 which supply nitrogen and argon, respectively, to the furnace 90 of the reaction cell 100 may be provided. A first valve 310 and a second valve 320 may be connected to the first supply source 315 and the second supply source 325, and nitrogen and argon may be supplied to the furnace 90 and supply of nitrogen and argon may be cut off by opening and closing the first valve 310 and the second valve 320. Here, a controller 300 may control opening and closing of the first valve 310 and the second valve 320. Further, the controller 300 may increase vacuum-pumping by opening a vacuum valve 400, and may thus maintain the vacuum state of the inside of the furnace 90.

Grooves 52a may be formed on the surface of the first ring 52, and gases, such as nitrogen and argon, may flow through the grooves 52a. The top view and side view of the first ring 52 are shown in the lower part of the right side of FIG. 2. In the same manner as the first ring 52, grooves may be formed on the second ring 54.

FIG. 3 is a longitudinal-sectional view of one example of the filter shown in FIG. 1, FIGS. 4A to 4E are cross-sectional views of respective examples of through holes provided in the filter shown in FIG. 3, FIGS. 5A to 5E are perspective views of the respective examples of the through holes provided in the filter shown in FIG. 3, and FIG. 6a and FIG. 6b are a perspective view three-dimensionally illustrating the arrangement of first to third through holes of the filter shown in FIG. 3. Hereinafter, one example of the filter 30 will be described with reference to FIGS. 3 to 6b.

The filter 30 may include a first layer 31, a second layer 32, and a third layer 33, which are sequentially disposed in a direction from the source to the seed. The first to third layers 31-33 may be plates having a predetermined thickness t2 and formed of graphite. Here, the first to third layers 31 to 33 may have the same thickness t2, and particularly, may not be flat and may have roughness. The predetermined thickness t2 may be on 1 nanometer to 10 centimeters.

First through holes, second through holes, and third through holes may be formed through the first layer 31, the second layer 32, and the third layer 33, respectively. The first to third through holes may have a predetermined width t1, and the predetermined width t1 may be on 1 nanometer to 10 centimeters.

Further, the first layer 31 and the second layer 32 may be spaced apart from each other, the second layer 32 and the third layer 33 may be spaced apart from each other, and a distance t3 between the first layer 31 and the second layer 32 and a distance between second layer 32 and the third layer 33 may be on 1 nanometer to 10 centimeters. Further, the distance t3 between the first layer 31 and the second layer 32 may be the same as the distance between second layer 32 and the third layer 33.

The first to third through holes formed through the first to third layers 31-33 may not overlap each other in the vertical direction, i.e., in the y-axis direction in FIG. 3. In more detail, the first through holes formed through the first layer 31 may not overlap the second through holes formed through the second layer 32, the second through holes formed through the second layer 32 may not overlap the third through holes formed through the third layer 33, and the first through holes formed through the first layer 31 may not overlap the third through holes formed through the third layer 33.

Through the non-overlapping arrangement of the first through holes to the third through holes, when a gas flow formed by sublimation of the source 20 passes through the filter 30, the gas flow collides with the inner walls of the first through holes to the third through holes, and at this time, the above-described particles collide with or are adsorbed onto the inner walls of the first through holes to the third through holes, and thus, most of the particles may be removed from the gas flow having completely passed through the filter 30.

While one graphite plate has a small thickness and thus it is difficult to form through holes through the graphite plate to be curved in the longitudinal direction, in this embodiment, three graphite plates are formed as the first to third layers, the first to third through holes formed through the first to third layers are arranged not to overlap each other in the longitudinal direction, and thereby, it may be expected to have an effect similar to holes which are formed to be curved in the longitudinal direction.

For the purpose of the above-described particle removal effects, the first through holes to the third through holes are preferably arranged not to overlap each other in the vertical direction, as described above, and more preferably, the first through holes to the third through holes form a face-centered cubic structure, as shown in FIG. 6a and FIG. 6b. In FIG. 6a and FIG. 6b, disposition of the first and third layers 31-33 is omitted and only the first through holes to the third through holes are displayed, the first through holes to the third through holes may be arranged in the face-centered cubic structure, and in more detail, the centers of first through holes to the third through holes may form the face-centered cubic structure.

In the above-described the face-centered cubic structure, the first through holes to the third through holes may be effectively arranged in the first layer 31 to the third layer 33 in the filter 30, and simultaneously, the gas may travel in curved paths based on the vertical direction, thereby being capable of preventing the particles from passing through the filter 30.

Further, the gas flow may not be smooth in the case that the first layer 31 and the second layer 32 are not spaced apart from each other or the second layer 32 and the third layer 33 are not spaced apart from each other in the state in which the first through holes to the third through holes do not overlap in the vertical direction, and therefore, the first layer 31 and the second layer 32 may be spaced apart from each other and the second layer 32 and the third layer 33 may be spaced apart from each other, as described above.

The first layer 31 to the third layer 33 may be formed of the same material and may have the same configuration other than the above-described non-overlapping arrangement of the first through holes to the third through holes. Further, when the first through holes to the third through holes have the same shape, the gas flow from the source to the seed may be evenly distributed throughout all areas in the reaction cell.

As shown in FIGS. 4A to 4E, the cross-section of the first through holes to the third through holes, i.e., the cross-section thereof in the x-axis direction of FIG. 3, may be a polygon, such as a circle, an oval, a rectangle, a hexagon, an octagon, etc., without being limited thereto.

For reference, the x-axis direction of FIG. 3 may be referred to as a lateral direction or a horizontal direction, and the y-axis direction may be referred to as a longitudinal direction or a vertical direction.

FIGS. 5A to 5E are perspective views of the respective examples of the through holes provided in the filter shown in FIG. 3.

In the example shown in FIG. 5A, the width t11 of the lower part of the through hole and the width t12 of the upper part of the through hole may be the same. Here, the lower part of the through hole indicates the part of the through hole facing in the direction towards the source, and the upper part of the through hole indicates the part of the through hole facing in the direction towards the seed.

In the example shown in FIG. 5B, the width t21 of the lower part of the through hole may be greater than the width t22 of the upper part of the through hole, and, in the example shown in FIG. 5C, the width t32 of the upper part of the through hole may be greater than the width t31 of the lower part of the through hole.

In the embodiment shown in FIG. 5D, the through hole may have a width t43 of the middle region larger than the width t41 of the lower part and the width t42 of the upper part. And, in the embodiment shown in FIG. 5E, the through hole may have a width t43 of the middle region larger smaller than the width t41 of the lower region and the width t42 of the upper part.

In the embodiments shown in FIGS. 5D and 5E, the width t41, t51 of the lower part and the width t42, t52 of the upper part are shown to be the same, but are not necessarily limited thereto. FIGS. 5D and 5E may show an embodiment in which the width t43, t53 of the middle region of the largest and smallest, respectively.

The structures of the through holes shown in FIGS. 5B and 5C may adjust the gas flow from the source to the seed. Particularly, in the example shown in FIG. 5B, when the width or the cross-sectional area of the through hole is decreased in the direction from the source to the seed, pressure when the gas collides with the inner wall of the through hole is increased, and thereby, adsorptive force of particles in the gas onto the inner wall of the through hole may be further increased.

In another example, the first through holes to the third through holes may have the same shape but may have different sizes. For example, the first through holes to the third through holes may have a cylindrical shape, as shown in FIG. 5A, the same width t11 or t12 of the upper and lower parts of the second through holes may be smaller than the same width t11 or t12 of the upper and lower parts of the first through holes, and the same width t11 or t12 of the upper and lower parts of the third through holes may be smaller than the same width t11 or t12 of the upper and lower parts of the second through holes.

The above-described first to third through holes function as a plurality of passages which moves gas generated by sublimation of the source in a direction which is not parallel to the longitudinal direction, i.e., in a direction which does not coincide with the y-axis direction of FIG. 3. Here, the first to the third through holes forming the above-described face-centered cubic structure may be points in the plurality of passages.

The shape of the first through holes to the third through holes may be configured such that the widths of the cross-sections of the through holes are decreased in the direction from the source to the seed, pressure when the gas collides with the inner wall of the through hole is gradually increased, and thereby, adsorptive force of particles in the gas onto the inner wall of the through hole may be further increased.

Further, although the above-described examples show that the filter includes the three layers having the through holes, the filter may include four or more layers. Here, a fourth layer disposed on the third layer may have the same shape as the first layer, and may be disposed to overlap the first layer in the vertical direction.

FIG. 7 is a flowchart representing a SiC crystal growth method according to one embodiment of the present invention.

First, a source including carbon and silicon is disposed in the lower region of a reaction cell, and a seed is disposed in the upper region of the reaction cell (S110). The source may include granulated SiC, or silicon and carbon. The seed is fixed to a cover of the reaction cell in the upper region of the reaction cell.

Thereafter, a filter is disposed between the source and the seed in the reaction cell (S120). The filter may include first to third layers, the first to third layers may be graphite plates, and a plurality of first to third through holes may be formed through the first to third layers, respectively.

Thereafter, the reaction cell may be evacuated, and may be filled with inert gas (S130). Here, the reaction cell may be filled with the inert gas at a pressure exceeding 600 Torr. In detail, the above-described controller evacuates the reaction cell by opening a vacuum pump and increasing vacuum-pumping, and may supply nitrogen and argon to the reaction cell from a first supply source and a second supply source by opening a first valve and a second valve.

Thereafter, the reaction cell may be heated (S140). In detail, the controller may apply power to a heater unit, such as an RF induction coil, so that the heater unit may heat the reaction cell to a temperature of 2,000 to 2,500° C.

Thereafter, when the reaction cell is again evacuated, gas may be generated by sublimation of the heated source, and may flow towards the seed (S150). Here, the reaction cell may be vacuated at a pressure of 0.1 to 100 Torr by opening the vacuum valve and increasing vacuum-pumping by the above-described controller. Then, the source including granulated SiC, or carbon and silicon may be heated and sublimated to generate gas, and the gas may include carbon and silicon.

Thereafter, particles may be filtered out from the gas while the gas passes through the filter (S160). That is, the gas may include the particles having a large size in addition to carbon atoms and silicon atoms, and most of the particles may be silicon particles and carbon particles.

As described above, the filter may include a first layer, a second layer, and a third layer including first through holes, second through holes, and third through holes, respectively. The first through holes to the third through holes are arranged not to overlap each other in the longitudinal direction, and therefore, when the flow of the gas generated by sublimation of the source passes through the filter, the gas flow collides with the inner walls of the first through holes to the third through holes. Here, the gas flows upwards while changing paths depending on the curved arrangement structure of the through holes, and the particles having momentum in the gas may collide with or be adsorbed onto the inner walls of the first through holes to the third through holes by inertia. Therefore, most of the particles may be removed from the gas flow having completely passed through the filter.

The gas having passed through the filter may be deposited on the seed, and thereby, SiC crystals may be grown (S170). Here, the particles are removed from the gas while passing through the filter and thus the particles are not deposited on the SiC crystals, and therefore, no SiC crystal defect is generated and thus the quality of the SiC crystals may be improved.

As is apparent from the above description, a SiC crystal growth apparatus and method according to one embodiment of the present invention have the following effects.

First through holes to the third through holes formed in a filter are arranged not to overlap each other in the longitudinal direction, and therefore, when the flow of gas generated by sublimation of a source passes through the filter, the flow of the gas collides with the inner walls of the first through holes to the third through holes. Here, the gas flows upwards while changing paths depending on the curved arrangement structure of the first through holes to the third through holes, and particles in the gas may collide with or be adsorbed onto the inner walls of the first through holes to the third through holes by inertia. Therefore, most of the particles are removed from the gas flow having completely passed through the filter and thus the particles are not deposited on SiC crystals, and therefore, no SiC crystal defect is generated and thus the quality of the SiC crystals may be improved.

Although the embodiments of the present invention have described that all the elements are coupled into one unit or are operated in a coupled state, as described above, the present invention is not limited to these embodiments. That is, all the elements may be selectively coupled to one or more units and be operated, within the scope of the invention. Further, the above-described terms "comprising," "including," and "having," are inclusive and therefore specify the presence of stated elements, but do not preclude the presence or addition of one or more other elements, unless stated otherwise. Further, all terms including technical or scientific terms have the same meanings which are generally understood by those skilled in the art to which the present invention pertains, unless defined otherwise. Terms which are generally used, such as terms defined in dictionaries, should be interpreted as having meanings coinciding with contextual meanings in related technology, and should not be interpreted as having ideally or excessively formal meanings.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims. Therefore, the embodiments of the present invention described as above have been disclosed for illustrative purpose, and the scope and spirit of the invention are not limited thereby. Therefore, the scope of the present invention is defined not by the detailed description, but by the claims and their equivalents, and all variations within the scope of the claims and their equivalents are to be construed as being included in the present invention.

What is claimed is:

1. A SiC crystal growth apparatus, comprising:
   a reaction cell provided in a vacuum furnace such that SiC crystals are grown in the reaction cell, wherein the reaction cell is configured such that:
      a source comprising carbon and silicon is disposed in a lower region of an area defined by a crucible and a cover, and a seed is provided below the cover; and
      a filter configured to filter out particles from gas supplied from the source is provided between the seed and the source, wherein:
         the filter comprises a first layer, a second layer, and a third layer overlapped in a direction from the source to the seed, and spaced apart from each other;
         first through holes, second through holes, and third through holes are formed through the first layer, the second layer, and the third layer, respectively; and
         the first through holes, the second through holes, and the third through holes are arranged not to overlap each other in a longitudinal direction.

2. The SiC crystal growth apparatus according to claim 1, wherein centers of the first through holes, the second through holes, and the third through holes form a face-centered cubic structure.

3. The SiC crystal growth apparatus according to claim 1, wherein the first layer, the second layer, and the third layer have a thickness of 1 nanometer to 10 centimeters.

4. The SiC crystal growth apparatus according to claim 1, wherein the first layer and the second layer or the second layer and the third layer are spaced apart from each other by 1 nanometer to 10 centimeters.

5. The SiC crystal growth apparatus according to claim 1, wherein the first through holes, the second through holes, and the third through holes have the same shape.

6. The SiC crystal growth apparatus according to claim 1, wherein the first through holes, the second through holes, and the third through holes have the same shape, but have different sizes.

7. The SiC crystal growth apparatus according to claim 6, wherein the size of the first through holes in a lateral direction is the largest, and the size of the third through holes in the lateral direction is the smallest.

8. The SiC crystal growth apparatus according to claim 1, wherein the first through holes, the second through holes, and the third through holes have a circular, polygonal, or oval cross-section.

9. The SiC crystal growth apparatus according to claim 8, wherein the cross-section of each of the first through holes, the second through holes, and the third through holes is decreased in the direction from the source to the seed.

10. The SiC crystal growth apparatus according to claim 1, further comprising an insulator configured to surround the reaction cell.

11. The SiC crystal growth apparatus according to claim 1, further comprising a filter support configured to support an edge of the filter on an inner wall of the reaction cell.

12. The SiC crystal growth apparatus according to claim 11, wherein the inner wall of the reaction cell has an inclined portion configured to be inclined inwards from an upper region of the source to the filter support.

13. The SiC crystal growth apparatus according to claim 1, further comprising a fixing member configured to fix the seed to the cover.

14. The SiC crystal growth apparatus according to claim 1, wherein a width of an inner wall of the reaction cell at a height between the source and the filter is smaller than a width of the inner wall of the reaction cell at a height equal to the source and a width of the inner wall of the reaction cell at a height equal to the filter.

15. A SiC crystal growth method, comprising:
    disposing a source comprising carbon and silicon in a lower region of a reaction cell, and disposing a seed in an upper region of the reaction cell;

evacuating the reaction cell, and filling the reaction cell with inert gas;

heating the reaction cell;

again evacuating the reaction cell, and moving gas comprising carbon and silicon atoms from the source towards the seed; and filtering out carbon or silicon particles from in the gas through a filter, wherein, in filtering out the carbon or silicon particles:

the filter comprises first, second, and third graphite plates overlapped in a direction from the source to the seed, provided with first, second, and third through holes respectively formed therethrough, and having a thickness of 1 nanometer to 10 centimeters is used; and centers of the first through holes, the second through holes, and the third through holes form a face-centered cubic structure.

16. The SiC crystal growth method according to claim 15, wherein, in filling the reaction cell, the reaction cell is filled with the inert gas at a pressure exceeding 600 Torr.

17. The SiC crystal growth method according to claim 15, wherein, in heating the reaction cell, the reaction cell is heated to a temperature of 2,000 to 2,500° C.

18. The SiC crystal growth method according to claim 15, wherein, in again evacuating the reaction cell, the reaction cell is evacuated at a pressure of 0.1 to 100 Torr.

19. A SiC crystal growth apparatus, comprising:

a reaction cell provided in a vacuum furnace such that SiC crystals are grown in the reaction cell, wherein the reaction cell is configured such that:

a source comprising carbon and silicon is disposed in a lower region of an area defined by a crucible and a cover, and a seed is provided below the cover; and a filter configured to filter out particles from gas supplied from the source is provided between the seed and the source, the filter comprising first, second, and third graphite plates overlapped in a direction from the source to the seed, wherein the filter has a plurality of passages configured to move the gas in a direction not parallel to a longitudinal direction.

20. The SiC crystal growth apparatus according to claim 19, wherein the plurality of passages comprises points configured to form a face-centered cubic structure in the filter.

* * * * *